US011856837B2

(12) United States Patent
Gandhiraman

(10) Patent No.: US 11,856,837 B2
(45) Date of Patent: Dec. 26, 2023

(54) METHOD TO PRINT ORGANIC ELECTRONICS WITHOUT CHANGING ITS PROPERTIES

(71) Applicant: Universities Space Research Association, Mountain View, CA (US)

(72) Inventor: Ramprasad Gandhiraman, Sunnyvale, CA (US)

(73) Assignee: Universities Space Research Association, Columbia, MD (US)

( * ) Notice: Subject to any disclaimer, the term of this patent is extended or adjusted under 35 U.S.C. 154(b) by 341 days.

(21) Appl. No.: 17/135,086

(22) Filed: Dec. 28, 2020

(65) Prior Publication Data

US 2021/0257549 A1 Aug. 19, 2021

Related U.S. Application Data

(63) Continuation of application No. 15/610,521, filed on May 31, 2017, now abandoned.

(60) Provisional application No. 62/343,133, filed on May 31, 2016.

(51) Int. Cl.

*H10K 71/13* (2023.01)
*B41J 2/00* (2006.01)
*H10K 71/60* (2023.01)

(52) U.S. Cl.

CPC ................ *H10K 71/13* (2023.02); *B41J 2/00* (2013.01); *H10K 71/611* (2023.02)

(58) Field of Classification Search

CPC ........................ H01L 51/0004; H01L 51/0022
See application file for complete search history.

(56) References Cited

U.S. PATENT DOCUMENTS 8,460,283 B1 * 6/2013 Laroussi .................. H05H 1/44 606/49
2002/0001540 A1 * 1/2002 Nakagawa ........... G01N 27/626 422/54

* cited by examiner

*Primary Examiner* — Yuechuan Yu
(74) *Attorney, Agent, or Firm* — Whiteford, Taylor & Preston, LLP; Peter J. Davis

(57) ABSTRACT

Method for high throughput, highly reproducible, direct write plasma jet deposition of organic electronic materials through nozzles containing non-concentric tubes with inner tube having higher dielectric constant and/or higher wall thickness than the outer tube, so that the inner tube containing the aerosol of organic electronic materials is shielded from the outer tube containing plasma and the organic electronics is focused at the outlet of the nozzle through the after-glow region of the atmospheric pressure plasma. Ensuring reproducibility of the method for printing organic electronic materials by removing the contaminants and residues in inner tube using reactive gas and generating a plasma discharge at a potential significantly higher than the operating potential for printing so that the plasma is generated in both the inner and outer tube for dielectric barrier discharge plasma jet based cleaning of the nozzle.

5 Claims, 2 Drawing Sheets

METHOD TO PRINT ORGANIC ELECTRONICS WITHOUT CHANGING ITS PROPERTIES

BACKGROUND OF THE INVENTION

Field of the Invention

This invention relates to the high throughput direct write printing of conducting electronic materials, using the after-glow region of the atmospheric pressure dielectric barrier discharge plasma jet, without changing the material properties and chemical structure upon printing.

Description of the Background

With the development of organic electronic materials, there is a need for developing high throughput printing technology to meet the growing needs for fabrication of organic light emitting diodes, organic photovoltaics, electronic papers, wearable electronics, touch panels, flexible displays and sensors.

Deposition of organic conducting polymers, small molecules, dendrimers, fluorescent and phosphorescent molecules in a high throughput fashion is challenging as it is absolutely essential to retain the chemical structure and bonding environment of the materials upon printing.

Any change in the chemical bonding and or chemical structure will result in poor performance behavior with deteriorated conducting characteristics.

In a display device using organic light emitting diodes, several layers of materials will be printed including anode, cathode, hole injection layer, emissive layer, interlayer etc., which is required for improved device performance. Different layers require materials with varying characteristics including transparent conducting oxides which require both good optical properties as well as conducting properties.

Deposition of materials with dual functionalities like good optical behavior as well as good electronic conduction behavior require printing methods that will enable printing inks in a highly directional and high throughput fashion without compromising the optical and electronic properties.

Currently a combination of one or more techniques including vacuum evaporation, vacuum based plasma sputtering, screen printing, photolithograpy, ink jet printing, aerosol printing etc., are used to prepare display screens, photovoltaic devices, flexible electronic devices etc.

Photolithography, screen printing, laser induced sintering, plasma spray, inkjet printing, aerosol printing, laser sintering are all explored for site selective printing of metals and metal oxides, and organic electronics.

Different deposition tools and methods must be adopted for different materials depending on the nature and type of substrate, material to be deposited and the substrate area. This also means increased processing time and increased number of printing tools required for different materials.

Atmospheric pressure plasma based printing of electronic materials have been reported. However, the method described in the literatures will change the properties of the materials as the aerosol containing electronic materials enters the plasma region due to the presence of high energy ions, radicals and electrons in the plasma region. The effect of plasma on the chemical structure of materials resulting in polymerization is a known phenomenon. There is a need to shield the electronic materials from direct exposure to high energy plasma discharge region between the electrodes.

SUMMARY OF THE INVENTION

Fabrication of devices that use organic electronics, including display devices, photovoltaic devices, touch displays, optoelectronic devices, flexible electronics and wearable electronics, needs high throughput deposition methods that can deposit organic electronics and associated electronic materials in a controlled fashion without compromising the film quality and device performance.

Vacuum evaporation techniques, vacuum plasma sputtering methods, inkjet printing, screen printing, aerosol printing are the techniques widely used for fabrication of display devices and flexible electronic devices.

The organic light emitting diode (OLED) display devices, touch panels, flexible displays and photovoltaic devices require multiple layers of materials including cathode coating, anode coating, electron injection layer, electron transporting layer, exciton/hole blocking layer, emissive layer, exciton/electron blocking layer, hole transporting layer, hole injection layer and interlayers that exhibit varying optical and electronic properties Transparent conductive oxides (TCO) are used as transparent electrode materials in optoelectronic devices, touch panels, flat displays, organic photovoltaics, organic light emissive devices, etc. These electrode materials are prepared using vacuum evaporation, vacuum (low pressure) plasma sputtering, chemical vapor deposition, electro/electroless chemistry etc.

Deposition of additional organic electronic materials and electroluminescent materials requires methods other than those used for transparent conductive oxide film fabrication, as the organic materials performance depends strongly on the method of preparation.

Deposition of small molecules, conjugated polymers, electro luminescent layers, conducting polymer layers etc., requires printing techniques that will not alter the chemistry and bond structure of the conducting polymer and electro luminescent/light emissive layers.

Screen printing and ink jet printing methods require pre- and post-processing to enhance the adhesion and to optimize the performance of device. Also, these techniques require substrates to be placed parallel to the ground as the ink dispensing is designed to work on surfaces placed parallel to the ground rather than upright position or facing the wall.

Plasma jet printing techniques described in the prior art for printing of electronic materials will not work for organic electronics, small molecules, conjugated polymers and electroluminescent materials, as the intense plasma region between the positive and ground electrode is intense and rich in electrons, ions and free radicals for all types of gases used for creating the discharge.

The plasma species in the plasma region between the electrodes can either polymerize the organic materials or break the conjugated bonds which are crucial for electronic conductivity and optimal device performance. However, the plasma jet could be effectively used for directing the organic electronic materials and for increasing the throughput of the printing.

This invention discloses high throughput plasma jet printing of organic electronic materials, small molecules, conjugated polymers, electroluminescent materials and other electron, hole injection, emissive layers without changing its material properties during plasma printing.

Atmospheric pressure plasma jet with dielectric barrier discharge is used for this purpose. However, the nozzle is designed in such a way that only the after-glow region of the atmospheric plasma, which does not contain energetic plasma species, comes in contact with the aerosol containing organic electronic materials, and the plasma region containing the high energy plasma species is shielded from direct interaction with the aerosol containing organic electronic materials.

This method uses after-glow of the plasma discharge to propel the material towards substrate while preventing the aerosol containing organic electronic materials from getting directly exposed to the plasma zone between the electrodes.

The printing nozzle consists of two non-concentric tubes with the outer tube containing the electrodes connected to high voltage power supply, and the inner tube that carries the aerosol of organic electronic materials to the substrate.

The outer tube connected to a gas source will contain a plasma discharge.

The inner tube is made of higher dielectric constant or thicker inner wall than the outer tube so that the plasma is contained only in outer tube and shielded from high energy species of the plasma in the inner tube.

The nozzle contains two regions i) plasma region that exists inside the outer tube (in between the outer wall of the inner tube and inner wall of the outer tube) and in between the two electrodes placed at the outside tube and ii) after-glow region that extends beyond the nozzle outlet.

The plasma region contains high energy plasma species including accelerating electrons, ion, free radicals and excited species which will affect the material properties of the organic electronic materials if the material comes in contact with the plasma species in plasma region. The after-glow region contains de exciting plasma species with much less electron density, ion density, electron temperature, ion temperature and much less free radicals which will not affect the material properties if carefully controlled.

The plasma jet printing nozzle design of the invention contains both plasma jet and an aerosol of organic electronic material separated by a dielectric material that protects organic electronic materials in the aerosol from getting directly exposed to high energy plasma species.

The nozzle head of the preferred embodiment of the invention consists of two non-concentric tubes to enable directionality and to get an increased after-glow region immediately outside the nozzle so that the after-glow plasma discharge is efficiently used for printing organic electronic materials that is carried through an aerosol and a gas through the inner tube of the nozzle.

Unlike the plasma jet printing techniques of the prior art, this technique prevents aerosol containing organic electronic materials from getting directly exposed to the high energy plasma species in the plasma region which could potentially change the chemical structure of the organics.

Therefore, there is presented according to the invention, systems and methods for focused plasma jet deposition of organic electronic materials without changing its material properties by the plasma species by containing aerosol through non-concentric nozzles connected to high voltage power supply, in the presence of electric field and plasma, that enables printing of organic electronic materials in the aerosol using the after-glow region of the atmospheric pressure dielectric barrier discharge plasma.

The outer non-concentric nozzle that sustains the plasma and through which the gas for creating the plasma discharge is fed is connected to high voltage power supply through one or more electrodes. The nozzle can be made of any or all of the following silicon wafer, quartz, glass, ceramic, plastic, machinable ceramic, glass reinforced epoxy, polyimide, polyetheretherketone, fluoropolymer, aluminum, silicon wafer containing layers of silicon oxide and metals layers embedded on it.

The diameter of the nozzle used for deposition of conducting metal layers can be varied from about 10 mn to about 50 mm. The diameter determines throughput, deposition rate, pattern size, etc.

The electrodes connected to the nozzle to create the plasma can either be externally bound or patterned and deposited to be part of the nozzle by using silicon micro machining and micro electromechanical systems processing depending on the diameter requirement of the nozzle and the resolution of the metal deposition needed.

In the case of a silicon micro machined nozzle, the nozzle on the silicon substrate can either be formed using any of the known silicon processing steps like wet etching, dry etching, deep reactive ion etching.

Non concentric type nozzles can be created by wet chemical etching of silicon substrates.

The nozzle can be connected to a range of reactive and or non-reactive gases depending on the requirements.

The organic electronic materials in the aerosol upon entering the after-glow region just outside the nozzle is carried forward to the substrate by less energetic deexciting plasma species.

The electronic materials to be printed using the after-glow region of the plasma jet printer could include any of the following materials conjugated polymer, poly[9,9-dioctyl fluorine-co-N-(4-butylphenyl) diphenylamine] (TFB), poly (3,4-ethylenedioxythiophene) and poly(styrene sulfonic acid) (PEDT: PSS, hole injection layer), emissive polymer poly(9,9-dioctyl fluorine-co-benzothiadiazole) (F8BT), small molecule, fluorescent phosphorescent materials, dendrimers, poly phenylene, poly fluorene, poly phenylene, dithienyl benzothiadiazole, poly fluorene, poly carbazole, poly vinyl carbazole, transparent conducting oxides including indium oxide, zinc oxide, tin oxide nanomaterials, carbon nanotubes, nickel oxide, aluminum oxide, copper oxide, copper aluminum oxide, indium based oxides, zinc based oxides, indium tin oxide, silver, silver oxide, N,N'-diphenyl-N,N'-bis(3-methylphenyl)-1,1'-diphenyl-4,4'-diamin (TPD), tris-(8-hydroxyquinoline) aluminum ($Alq_3$).

In order to get reproducible coating over a large cycle, it is essential to clean the inner tube to remove the contaminants and residues so that the printed organic electronic materials retain the required properties and are not altered during deposition.

The reproducibility of organic materials printing can be achieved by using a plasma cleaning step by allowing reactive gases inside the inner tube and igniting a plasma discharge at a potential significantly higher than the operating potential for printing so that the plasma is generated both in the inner tube and outer tube. This will enable cleaning of residues formed during deposition and ensure reproducible deposition

DETAILED DESCRIPTION OF THE INVENTION

Figure 1:
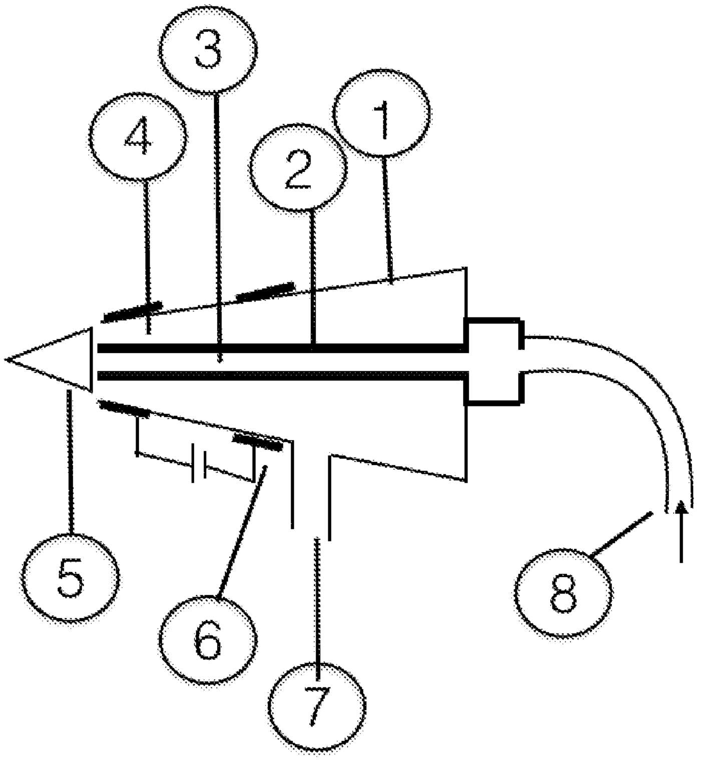
FIG. 1 shows a schematic of the plasma jet printer nozzle according to an embodiment of the invention containing non-concentric tubes with inner tube having a higher dielectric constant or wall thickness higher than the outer tube and with the outer tube having a conical shaped wall focused towards the nozzle outlet such that the gas in the outer tube undergoes turbulence and creates high pressure at the nozzle that drives the gas with high pressure and increased after-glow region.

FIG. 1 shows the schematic of the plasma jet printer nozzle for high throughput direct write printing of organic electronic materials using the after-glow region of the atmospheric pressure plasma and shielding of the aerosol containing organic electronics from the high energy plasma species generated in the dielectric barrier discharge. Various process gases including helium, argon, hydrogen, nitrogen, carbon dioxide, oxygen, methane, alkane, alkene, silane, carbon tetra fluoride, sulfur hexafluoride, etc., can be used on their own or with appropriate mixture to suit the need and depending on the suspension of the organic electronic material.

FIG. 1 shows the following elements:

Non concentric conical shaped outer tube 1 with a specific dielectric constant and a specific wall thickness, with a narrow end at the outlet of the nozzle;

Inner tube 2 with a dielectric constant and/or wall thickness higher than that of tube one;

Inner region 3 of the inner tube where the aerosol containing organic electronic materials will be transported towards the substrate by a feed gas and also the region that will be shielded from plasma in the outer region by the inner tube;

Plasma region 4 of the outer tube where a gas for creating discharge is fed and undergo high pressure constriction at the narrow region, and also the region rich in high energy plasma species including electrons, ions, free radicals, excited species, metastable species with high electron and ion density; this region corresponds to the area inside the outer tube and between the electrodes;

After glow region 5 outside the nozzle where the electrons and ions are at very low energy and contain mainly deexcited species, with low electron and ion density than the plasma region 4 existing between the electrodes 6 in outer tube;

Electrodes 6 placed in the outer side of the outer tube and connected to the high voltage power supply for generating plasma in the region 4;

Inlet 7 for gas that generates a plasma discharge in the region 4 and an after glow in the region 5;

Inlet 8 for aerosol containing the organic electronic materials and other electronic materials to be printed. This is also the inlet for passing reactive gases for plasma cleaning of the inner nozzle to retain the reproducibility of the printing process.

Figure 2:
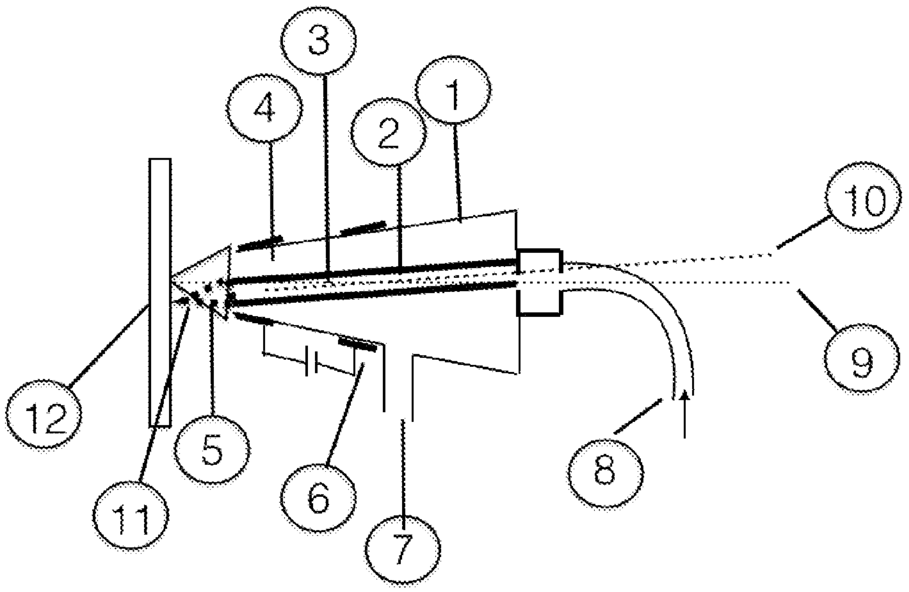
FIG. 2 shows a schematic of the plasma jet printer nozzle according to an embodiment of the invention containing two non-concentric tubes with the inner tube inclined at an angle above 0.1 degree and up to 45 degrees with provisions for the addition of various process gases through the sides of the outer nozzle. Various process gases including helium, argon, hydrogen, nitrogen, carbon dioxide, oxygen, methane, alkane, alkene, silane, carbon tetra fluoride, sulfur hexafluoride, etc., can be used on their own or with appropriate mixture to suit various requirements.

FIG. 2 shows the following elements:

Non concentric conical shaped outer tube 1 with a specific dielectric constant and a specific wall thickness, with a narrow end at the outlet of the nozzle;

Inner tube 2 with a dielectric constant and/or wall thickness higher than that of tube one;

Inner region 3 of the inner tube where the aerosol containing organic electronic materials will be transported towards the substrate by a feed gas and also the region that will be shielded from plasma in the outer region by the inner tube;

Plasma region 4 of the outer tube where a gas for creating discharge is fed and undergo high pressure constriction at the narrow region, and also the region rich in high energy plasma species including electrons, ions, free radicals, excited species, metastable species with high electron and ion density; this region corresponds to the area inside the outer tube and between the electrodes;

After glow region 5 outside the nozzle where the electrons and ions are at very low energy and contain mainly deexcited species, with low electron and ion density than the plasma region 4 existing between the electrodes 6 in outer tube;

Electrodes 6 placed in the outer side of the outer tube and connected to the high voltage power supply for generating plasma in the region 4;

Inlet 7 for gas that generates a plasma discharge in the region 4 and an after glow in the region 5;

Inlet 8 for aerosol containing the organic electronic materials and other electronic materials to be printed; this is also the inlet for passing reactive gases for plasma cleaning of the inner nozzle to retain the reproducibility of the printing process; the axis of the outer tube being 9;

The axis of the inner tube in 10 and different from 9 with angle between 0.1 degree to 45 degrees;

organic electronic materials 11 being directed by the after-glow region 5 on to the substrate 12;

According to one embodiment of the invention; the plasma jet printer nozzle preferably consists of non-concentric outer and inner tubes 1 and 2 made of any one or more of the following: silicon, silicon wafer, quartz, glass, ceramic, plastic, machinable ceramic, glass reinforced epoxy, polyimide, polyetheretherketone, fluoropolymer, aluminum, or any other dielectric material. The outer tube also may contain two metal electrodes 6 connected to high voltage power supply for creating a plasma discharge in the plasma jet chamber. The high voltage power supply can be any one of the following AC, DC, radio frequency, pulsed power supply. The after-glow region 5, through which the material to be deposited is focused to the substrate.

The outer and inner tubes 1 and 2 can either be made of same dielectric materials but with different wall thickness, with 2 preferably being thicker than 1, or the outer and inner tubes can be made of two different materials with varying dielectric constant with inner tube 2 having a higher dielectric constant than the outer tube 1.

Nonreactive, noble gases like helium, argon etc., can be used to create the discharge as well as for printing. In order to retain the chemical characteristics, electronic properties and optical properties of the materials, any of the non reactive gases including helium, argon, nitrogen could be used or gases which are compatible and non reactive with the solution of the organic electronic material. Reactive gases including nitrogen, oxygen, hydrogen, carbon dioxide, alkane, alkene, carbon tetra fluoride, sulfur hexafluoride etc., can be used for cleaning of the nozzle. The reactive and non-reactive gases can either be used on their own or with appropriate mixture of gases to obtain the required plasma processing condition.

The material to be coated may either taken as a colloid or as a solution and the colloid/solution is aerosolized and carried by a carrier gas into the non-concentric plasma jet tube where a plasma discharge is generated in the outer region 4 and the aerosol in region 3 is shielded from the high energy plasma species by the dielectric 2. Depending on the nature and type of nanomaterial/micromaterial/solution used, nature and type of coating required, concentration of the material in colloid/solution, and the nature and type of substrate used, the plasma process parameters may be tailored using appropriate gas mixtures, gas flow ratios and electrical energy input for generating the plasma.

In order to get an after-glow region that stays outside the nozzle and help print the organic electronic materials without changing its material properties, appropriate mixture of gases, gas flow ratios, concentration and electrical energy input are optimized to obtain desired film characteristics.

The electronic properties, optical properties, electro luminescent properties of the printed material will be maintained and optimized by appropriate choice of gas mixture and plasma process parameters.

Among the significant advantages of the present invention is the ability to print organic electronic materials in a high throughput fashion using the after-glow region of the atmospheric pressure plasma discharge and shielding the aerosol containing organic electronics from the high energy species of the plasma region between the electrodes using higher dielectric constant inner tube or inner tube with thicker wall to prevent plasma species surrounding the inner tube from interacting with the aerosol.

Display devices, touch panels, organic light emitting diodes, photovoltaic devices and similar such devices that use organic electronic materials required to be printed using multiple techniques with pre and/or post processing and longer processing time can now be accomplished with direct write plasma jet printing of the present invention. The after-glow-based direct write plasma jet printing allows chemical structure, electronic properties and optical properties to be maintained and preserved during the printing process by appropriate choice of gas and plasma process parameters.

The electron density of the plasma depends on various process conditions, and one prominent feature deciding the electron density of the plasma is the nature of gas used to generate the discharge. The electron densities in argon and helium are different. Argon plasma has higher electron density than the helium plasma for the same process parameters and for atmospheric pressure plasmas the electron density in argon is 2.5 times higher than helium. The thermal conductivity of gases also varies. As a result, the energy of the plasma varies depending on the nature and type of gases used to generate the discharge. When the aerosol containing organic electronic material enters the plasma, it will be subjected to electrons, ions and radical bombardment from the plasma species resulting in serious chemical structure change and modification of electronic and optical properties which will deteriorate the device performance. In order to avoid this the inner tune of the nozzle is designed in such a way that the plasma generated by dielectric barrier discharge will only be present in the outer tube and the inner tube will remain inert to the plasma species. The aerosol containing the organic electronic materials will only interact with the after-glow region of the plasma present outside the nozzle which will have much lesser ion and electron density as well as less energetic deexciting species that will not alter the material properties if properly controlled.

Having now fully set forth the preferred embodiments and certain modifications of the concept underlying the present invention, various other embodiments as well as certain variations and modifications of the embodiments herein shown and described will obviously occur to those skilled in the art upon becoming familiar with said underlying concept. It should be understood, therefore, that the invention may be practiced otherwise than as specifically set forth herein.

The invention claimed is:

1. A plasma jet printer for high throughput direct write printing of conducting electronic materials comprising: two non-concentric tubes, with an inner tube located inside an outer tube; said inner tube having at a first end an inlet through which an aerosol of electronic materials is introduced, said outer tube having a gas inlet through which a gas is introduced, an electrode assembly on the outer tube connected to a high voltage power supply for creating a plasma from said gas between the inner tube and the outer tube; a nebulizer connected to the inlet at the first end of the inner tube for generating the aerosol of electronic materials; said inner tube having a second end through which said aerosol of electronic materials exits; said outer tube having discharge end through which said plasma is discharged; said second end of said inner tube and said discharge end of said outer tube located in a common plane; and a substrate placed adjacent said second end of said inner tube and said discharge end of said outer tube to receive said discharged plasma and aerosol of electronic materials.

2. The plasma jet printer according to claim 1, wherein the aerosol of electronic materials can be organics, metals and/or metal oxides.

3. The plasma jet printer according to claim 1, wherein the aerosol of electronic materials includes poly[9,9-dioctyl fluorine-co-N-(4-butylphenyl) diphenylamine] (TFB), poly (3,4-ethylenedioxythiophene) and poly(styrene sulfonic acid) (PEDT: PSS, hole injection layer), emissive polymer poly(9,9-dioctyl fluorine-co-benzothiadiazole) (F8BT), small molecule, fluorescent phosphorescent materials, dendrimers, poly phenylene, poly fluorene, poly phenylene, dithienyl benzothiadiazole, poly fluorene, poly carbazole, poly vinyl carbazole, transparent conducting oxides including indium oxide, zinc oxide, tin oxide nanomaterials, carbon nanotubes, nickel oxide, aluminum oxide, copper oxide, copper aluminum oxide, indium based oxides, zinc based oxides, indium tin oxide, silver, silver oxide, N,N'-diphenyl-N,N'-bis(3-methylphenyl)-1,1'-diphenyl-4,4'-diamin (TPD), tris-(8-hydroxyquinoline) aluminum.

4. The plasma jet printer according to claim 1, where the gas includes non-reactive noble gases like argon, helium.

5. The plasma jet printer according to claim 1, wherein various process gases including helium, argon, hydrogen, nitrogen, carbon dioxide, oxygen, methane, alkane, alkene, silane, carbon tetra fluoride, sulfur hexafluoride, etc., can be used on their own or with appropriate mixture to suit various requirements.

* * * * *